United States Patent
Xu

(10) Patent No.: US 10,268,093 B2
(45) Date of Patent: Apr. 23, 2019

(54) ARRAY SUBSTRATE AND THE PREPARATION METHOD THEREOF, LIQUID CRYSTAL PANEL

(71) Applicant: Shenzhen China Star Optoelectronics Technology Co., Ltd., Shenzhen, Guangdong (CN)

(72) Inventor: Liang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 175 days.

(21) Appl. No.: 15/308,140

(22) PCT Filed: Sep. 26, 2016

(86) PCT No.: PCT/CN2016/100046
§ 371 (c)(1),
(2) Date: Nov. 1, 2016

(87) PCT Pub. No.: WO2018/040159
PCT Pub. Date: Mar. 8, 2018

(65) Prior Publication Data
US 2018/0217462 A1    Aug. 2, 2018

(30) Foreign Application Priority Data
Aug. 30, 2016 (CN) .......................... 2016 1 0776887

(51) Int. Cl.
*H01L 21/477*    (2006.01)
*H01L 29/786*    (2006.01)
(Continued)

(52) U.S. Cl.
CPC ...... *G02F 1/136286* (2013.01); *G02F 1/1362* (2013.01); *G02F 1/136227* (2013.01);
(Continued)

(58) Field of Classification Search
CPC ............... H01L 27/3262; H01L 27/124; H01L 27/3276; H01L 27/1251; H01L 27/1222
See application file for complete search history.

(56) References Cited

U.S. PATENT DOCUMENTS 5,696,386 A * 12/1997 Yamazaki ........... H01L 21/2026
                                                                        257/57
5,877,512 A     3/1999 Kim
(Continued)

FOREIGN PATENT DOCUMENTS

| CN | 1039926766 A | 7/2004 |
|---|---|---|
| CN | 102103293 A | 6/2011 |
| CN | 105388674 A | 3/2016 |

*Primary Examiner* — Brian Turner
(74) *Attorney, Agent, or Firm* — Andrew C. Cheng

(57) ABSTRACT

The present invention discloses an array substrate, which comprises a substrate; a gate line and a gate connected to the gate line on the substrate; a first insulating layer covering the gate line and the gate; an active layer on the first insulating layer; an organic layer on the first insulating layer, which exposes the active layer; a source, a drain, and a data line connected with the source on the organic layer, the source and the drain being respectively connected with the active layer, the data line and the gate line being overlapped; a second insulating layer covering the source, the drain, the data line, and the active layer; a contact hole in the second insulating layer, the contact hole exposing the drain; and a pixel electrode on the second insulating layer, the pixel electrode being contacted with the drain through the contact hole.

7 Claims, 3 Drawing Sheets

(51) Int. Cl.
*H01L 29/66* (2006.01)
*H01L 27/12* (2006.01)
*H01L 27/32* (2006.01)
*H01L 29/04* (2006.01)
*G02F 1/1362* (2006.01)

(52) U.S. Cl.
CPC ........ *H01L 27/124* (2013.01); *H01L 27/1222* (2013.01); *H01L 27/1262* (2013.01); *H01L 29/78669* (2013.01); *G02F 2001/136295* (2013.01)

(56) References Cited

U.S. PATENT DOCUMENTS

| | | |
|---|---|---|
| 2007/0278487 A1 | 12/2007 | Choung |
| 2011/0151631 A1 | 6/2011 | Choung |
| 2013/0126876 A1* | 5/2013 | Shin .................... H01L 29/6675 257/59 |
| 2013/0320339 A1* | 12/2013 | Kawashima ...... H01L 29/66765 257/43 |
| 2015/0200113 A1* | 7/2015 | Kishida ................ H01L 21/477 438/104 |

* cited by examiner

ARRAY SUBSTRATE AND THE PREPARATION METHOD THEREOF, LIQUID CRYSTAL PANEL

BACKGROUND OF THE INVENTION

1. Field of the Invention

The present disclosure relates to the fields of liquid crystal display technology, and in particular to an array substrate and the preparation method thereof, a liquid crystal panel.

2. The Related Arts

With the evolution of optoelectronic and semiconductor technology, it led to the rapid development of flat panel displays. In such many flat panel display, liquid crystal display (LCD) has been applied to all aspects of production and life because of having many superior characteristics of high space utilization efficiency, low power consumption, no radiation and low electromagnetic interference.

LCD displays typically comprises a liquid crystal panel and a backlight module opposite to each other. Wherein, since the liquid crystal panel cannot emit light, it requires a backlight module to provide uniform surface light source toward the liquid crystal panels, so that the liquid crystal panels can display images.

In the existing liquid crystal panel, the gate line and data line are disposed orthogonally. However, in this alignment method, the gate line and data line take up a lot of space of the substrate, which is not benefit to high aperture ratio.

SUMMARY OF THE INVENTION

To solve the above technical problems, the present invention provides an array substrate in which the gate lines and the data lines are overlapped and the preparation method thereof, a liquid crystal panel.

According to an aspect of the present invention, it provides an array substrate, comprising: a substrate; a gate line and a gate connected to the gate line on the substrate; a first insulating layer covering the gate line and the gate; an active layer on the first insulating layer; an organic layer on the first insulating layer, which exposes the active layer; a source, a drain, and a data line connected with the source on the organic layer, the source and the drain being respectively connected with the active layer, the data line and the gate line being overlapped; a second insulating layer covering the source, the drain, the data line, and the active layer; a contact hole in the second insulating layer, the contact hole exposing the drain; and a pixel electrode on the second insulating layer, the pixel electrode being contacted with the drain through the contact hole.

Furthermore, the organic layer comprises a through-hole, the width of the through-hole is larger than that of the active layer, which exposes the active layer and the first insulating layer there around.

Furthermore, the source on the organic layer extends to one terminal of the active layer through the first insulating layer exposed by the through-hole, the drain on the organic layer extends to another terminal of the active layer through the first insulating layer exposed by the through-hole.

Furthermore, the gate is opposite to the active layer.

According to another aspect of the present invention, it provides a preparation method of array substrate, comprising: providing a substrate; forming a gate line and a gate connected to the gate line on the substrate; forming a first insulating layer covering the gate line and the gate; forming an active layer on the first insulating layer; forming an organic layer on the first insulating layer, which exposes the active layer; forming a source, a drain, and a data line connected with the source on the organic layer, the source and the drain being respectively connected with the active layer, the data line and the gate line being overlapped; forming a second insulating layer covering the source, the drain, the data line, and the active layer; forming a contact hole in the second insulating layer; wherein, the contact hole exposes the drain; and forming a pixel electrode on the second insulating layer; wherein, the pixel electrode is contacted with the drain through the contact hole.

Furthermore, the specific method of the organic layer exposing the active layer is: forming a through-hole in the organic layer; wherein, the width of the through-hole is larger than that of the active layer, which exposes the active layer and the first insulating layer there around.

Furthermore, the specific method of the source and the drain being respectively connected with the active layer is: extending the source on the organic layer to one terminal of the active layer through the first insulating layer exposed by the through-hole, and extending the drain on the organic layer to another terminal of the active layer through the first insulating layer exposed by the through-hole.

According to further another aspect of the present invention, it provides liquid crystal panel, which comprises a color filter substrate and an array substrate arranged in a box aligning manner. The array substrate is the above array substrate, or the array substrate prepared using the above preparation method.

The beneficial effects of the present invention are as follows. Comparing to the data line and gate line disposed orthogonally according to prior art, the array substrate according to the present invention reduces the space of the substrate occupied by the gate lines and the data lines by overlapping the data lines and the gate lines, which increases the aperture ratio.

BRIEF DESCRIPTION OF THE DRAWINGS

By illustrating the accompanying drawings and the detailed descriptions as follows, the objects, the features and the advantages of the present invention will become more apparent, wherein.

DETAILED DESCRIPTION OF THE PREFERRED EMBODIMENTS

Figure 1:
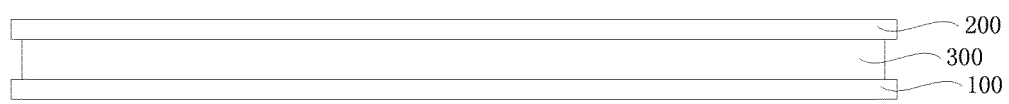
FIG. 1 is a schematic view illustrating the structure of the liquid crystal panel according to the embodiment of the present disclosure.

The detailed descriptions according to the preferred embodiment of the present invention are as follows. However, the present invention can be carried out in many different forms, which should not be construed as limited to the specific embodiments set forth herein. On the contrary, these embodiments are provided to explain the principles of the present invention and the practical applications thereof, so that those having ordinary skills in the art can understand various embodiments in the present invention and various modifications suited to the particular intended application.

In the drawings, to clear the device, it exaggerates the thickness of layers and regions. The same reference numerals in the drawings refer to the same elements.

FIG. 1 is a schematic view illustrating the structure of the liquid crystal panel according to the embodiment of the present disclosure.

Referring to FIG. 1, the liquid crystal panel according to the embodiment of the present disclosure comprises: an array substrate 100, a color filter substrate (CF substrate) 200 arranged in a box aligning manner, and a liquid crystal layer 300 provided between the array substrate 100 and the color filter substrate 200. Wherein, the liquid crystal layer 300 comprises several liquid crystal molecules. The color filter substrate 200 usually comprises a color filter composed of red (R) filter, green (G) filter, and blue (B) filter, a black matrix, and an alignment film. As for more detail structure of the color filter substrate, please refer to the relevant prior art, which is not repeated here.

Figure 2:
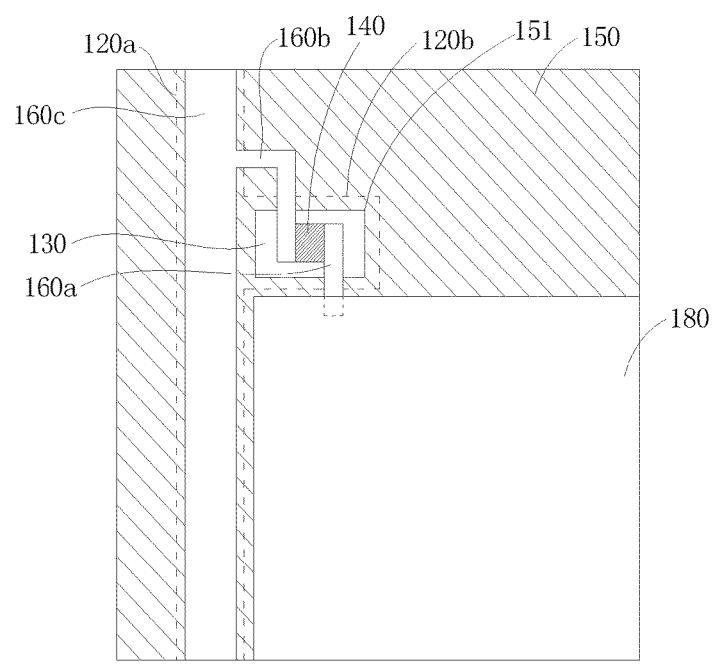
FIG. 2 is a plan view illustrating the array substrate according to the embodiment of the present disclosure.
Figure 3:
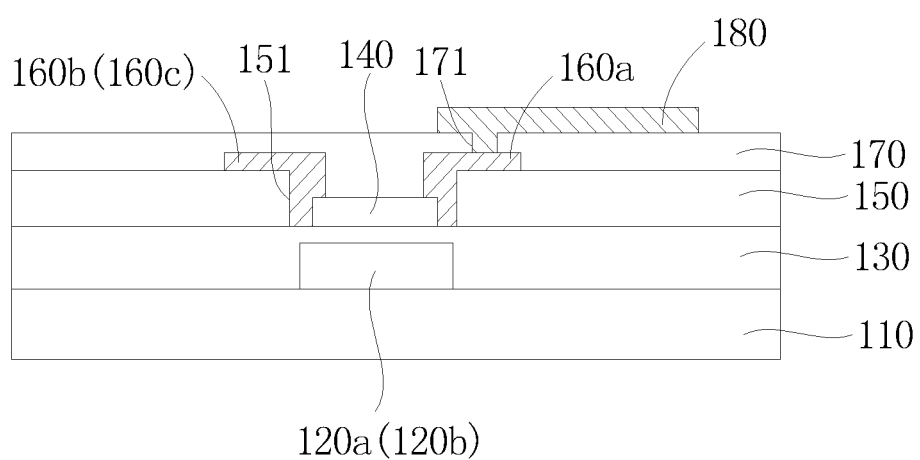
FIG. 3 is a lateral view illustrating the array substrate according to the embodiment of the present disclosure.
Figure 4:
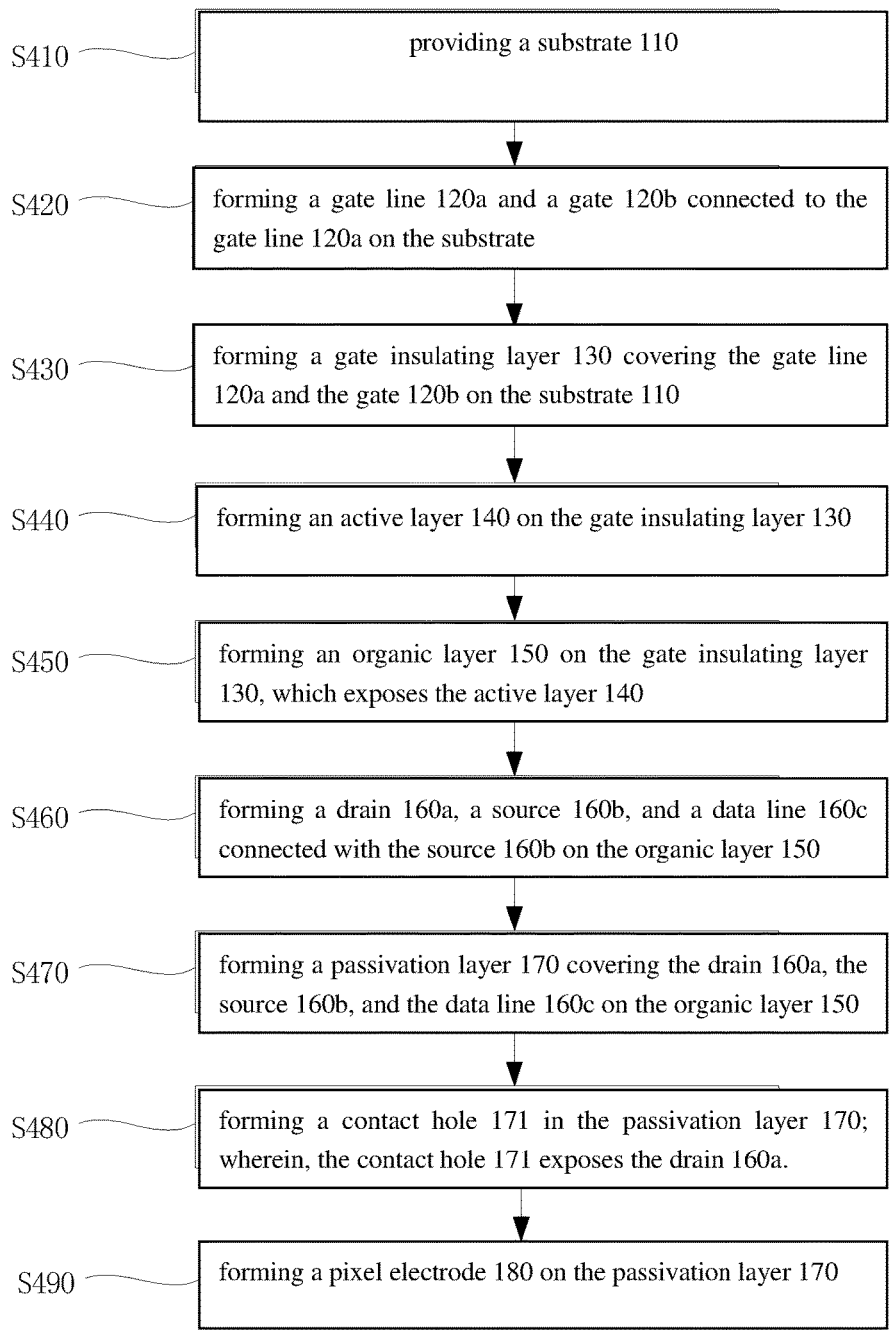
FIG. 4 is a flow chart of the preparation method of the array substrate according to the embodiment of the present disclosure.

The following describes the array substrate 100 according to the embodiment of the present invention in detail. FIG. 2 is a plan view illustrating the array substrate according to the embodiment of the present disclosure. FIG. 3 is a lateral view illustrating the array substrate according to the embodiment of the present disclosure. FIG. 4 is a flow chart of the preparation method of the array substrate according to the embodiment of the present disclosure. In FIG. 2, In order to clearly show the structures of a drain 160a, the source 160b and the data line 160c connected to the source 160b, the passivation layer 170 and the contact hole 171 formed in the passivation layer 170 are not shown. The structures of the passivation layer 170 and the contact hole 171 are referred to FIG. 3.

Referring to FIGS. 2 to 4, in the step S410, providing a substrate 110. Herein, the substrate 110 can be transparent glass substrate or resin substrate.

In step S420, forming a gate line 120a and a gate 120b connected to the gate line 120a on the substrate. Herein, the metal layer (not shown) formed on the substrate 110 can be exposed and developed, and then form the gate line 120a and the gate 120b. That is to say, the gate line 120a and the gate 120b are made of metal materials.

In step S430, forming a gate insulating layer 130 covering the gate line 120a and the gate 120b on the substrate 110. Herein, the gate insulating layer 130 can be formed from $SiO_x$, $SiN_x$ or the mixture of both.

In step S440, forming an active layer 140 on the gate insulating layer 130. Herein, the active layer 140 can be made of amorphous silicon (a-Si). Furthermore, the upper portion of the amorphous silicon can be doped, so that the lower portion of the active layer 140 is amorphous silicon, and the upper portion thereof is doped amorphous silicon.

Further preferably, the active layer 140 and the gate 120b are disposed opposite to each other, but the present invention is not limited thereto.

In step S450, forming an organic layer 150 on the gate insulating layer 130, which exposes the active layer 140.

Furthermore, the specific method of the organic layer 150 exposing the active layer 140 is: forming a through-hole 151 in the organic layer 150, making the width of the through-hole 151 larger than that of the active layer 140, which exposes the active layer 140 and the gate insulating layer 130 there around.

In the step S460, forming a drain 160a, a source 160b, and a data line 160c connected with the source 160b on the organic layer 150; wherein, the drain 160a and the source 160b are respectively connected with the active layer 140, and the data line 160c and the gate line 120a are overlapped.

Furthermore, the data line 160c and the gate lines 120a are parallel and overlapped spatially.

Furthermore, the specific method of the drain 160a and the source 160b being respectively connected with the active layer 140 is: extending the source 160b on the organic layer 150 to one terminal of the active layer 140 through the gate insulating layer 130 exposed by the through-hole 151, and extending the drain 160a on the organic layer 150 to another terminal of the active layer 140 through the gate insulating layer 130 exposed by the through-hole 151.

In the step S470, forming a passivation layer 170 covering the drain 160a, the source 160b, and the data line 160c on the organic layer 150. Herein, the passivation layer 170 can be formed from $SiO_x$, $SiN_x$ or the mixture of both.

In the step S480, forming a contact hole 171 in the passivation layer 170; wherein, the contact hole 171 exposes the drain 160a. Furthermore, the contact hole 171 exposes the portion of the drain 160a.

In the step S490, forming a pixel electrode 180 on the passivation layer 170; wherein, the pixel electrode 180 is contacted with the drain 160 a through the contact hole 171.

In summary, comparing to the data line and gate line disposed orthogonally according to prior art, the array substrate and the preparation thereof according to the present invention reduces the space of the substrate occupied by the gate lines and the data lines by overlapping the data lines and the gate lines, which increases the aperture ratio.

The present invention are mentioned above referring to the specific embodiments, but for those having ordinary skills in the art, those modifications and variations are considered encompassed in the scope of protection defined by the clams of the present invention.

What is claimed is:

1. An array substrate, comprising:
   a substrate;
   a gate line and a gate connected to the gate line on the substrate;
   a first insulating layer covering the gate line and the gate;
   an active layer on the first insulating layer;
   an organic layer on the first insulating layer, which exposes the active layer;
   a source, a drain, and a data line connected with the source on the organic layer, the source and the drain being respectively connected with the active layer, the data line and the gate line being overlapped;
   a second insulating layer covering the source, the drain, the data line, and the active layer;
   a contact hole in the second insulating layer, the contact hole exposing the drain;
   a pixel electrode on the second insulating layer, the pixel electrode being contacted with the drain through the contact hole; and
   wherein the organic layer comprises a through-hole, the width of the through-hole is larger than that of the active layer, which exposes the active layer and the first insulating layer there around.

2. The array substrate as claimed in claim 1, wherein the source on the organic layer extends to one terminal of the active layer through the first insulating layer exposed by the through-hole, the drain on the organic layer extends to another terminal of the active layer through the first insulating layer exposed by the through-hole.

3. The array substrate as claimed in claim 1, wherein the gate is opposite to the active layer.

4. A preparation method of array substrate, comprising:
   providing a substrate;

forming a gate line and a gate connected to the gate line on the substrate;

forming a first insulating layer covering the gate line and the gate;

forming an active layer on the first insulating layer;

forming an organic layer on the first insulating layer, which exposes the active layer;

forming a source, a drain, and a data line connected with the source on the organic layer, the source and the drain being respectively connected with the active layer, the data line and the gate line being overlapped;

forming a second insulating layer covering the source, the drain, the data line, and the active layer;

forming a contact hole in the second insulating layer; wherein, the contact hole exposes the drain;

forming a pixel electrode on the second insulating layer; wherein, the pixel electrode is contacted with the drain through the contact hole; and wherein the specific method of the organic layer exposing the active layer is:

forming a through-hole in the organic layer; wherein, the width of the through-hole is larger than that of the active layer, which exposes the active layer and the first insulating layer there around.

5. The preparation method of array substrate as claimed in claim 4, wherein the specific method of the source and the drain being respectively connected with the active layer is:

extending the source on the organic layer to one terminal of the active layer through the first insulating layer exposed by the through-hole, and extending the drain on the organic layer to another terminal of the active layer through the first insulating layer exposed by the through-hole.

6. The preparation method of array substrate as claimed in claim 4, wherein the gate is opposite to the active layer.

7. A liquid crystal panel, comprising a color filter substrate and an array substrate arranged in a box aligning manner; wherein, the array substrate comprises:

a substrate;

a gate line and a gate connected to the gate line on the substrate;

a first insulating layer covering the gate line and the gate;

an active layer on the first insulating layer;

an organic layer on the first insulating layer, the organic layer comprising a through-hole, the width of the through-hole being larger than that of the active layer, which exposes the active layer and the first insulating layer there around;

a source, a drain, and a data line connected with the source on the organic layer, the source on the organic layer extending to one terminal of the active layer through the first insulating layer exposed by the through-hole, the drain on the organic layer extending to another terminal of the active layer through the first insulating layer exposed by the through-hole, the data line and the gate line being overlapped;

a second insulating layer covering the source, the drain, the data line, and the active layer;

a contact hole in the second insulating layer, the contact hole exposing the drain; and a pixel electrode on the second insulating layer, the pixel electrode being contacted with the drain through the contact hole.

* * * * *